United States Patent
Tsuchie et al.

(10) Patent No.: US 9,285,411 B2
(45) Date of Patent: Mar. 15, 2016

(54) METHOD AND SYSTEM FOR IDENTIFYING AN ELECTRICAL NOISE PROPAGATION PATH

(71) Applicant: Hitachi, Ltd., Tokyo (JP)

(72) Inventors: Yoshiyuki Tsuchie, Commerce Township, MI (US); Hua Zeng, Novi, MI (US); Masayoshi Takahashi, West Bloomfield, MI (US); Hiroki Funato, Yokohama (JP)

(73) Assignee: Hitachi, Ltd, Tokyo (JP)

( * ) Notice: Subject to any disclaimer, the term of this patent is extended or adjusted under 35 U.S.C. 154(b) by 340 days.

(21) Appl. No.: 13/950,403

(22) Filed: Jul. 25, 2013

(65) Prior Publication Data

US 2015/0028888 A1   Jan. 29, 2015

(51) Int. Cl.
*G01R 29/26* (2006.01)
*G01R 29/08* (2006.01)
*G01R 31/00* (2006.01)

(52) U.S. Cl.
CPC ............ *G01R 29/26* (2013.01); *G01R 29/0814* (2013.01); *G01R 31/007* (2013.01); *G01R 31/001* (2013.01)

(58) Field of Classification Search
CPC ... G01R 29/26; G01R 31/007; G01R 29/0814
See application file for complete search history.

(56) References Cited

U.S. PATENT DOCUMENTS

| | | | | | |
|---|---|---|---|---|---|
| 4,806,845 | A * | 2/1989 | Nakano | ................. | G01R 29/26 324/603 |
| 6,184,693 | B1 * | 2/2001 | Arai | ................... | G01R 29/0814 324/144 |
| 6,396,653 | B1 * | 5/2002 | Haines | ................ | G11B 21/083 360/75 |
| 2003/0236459 | A1 * | 12/2003 | Loftman | ............. | G01S 7/52033 600/437 |
| 2004/0066208 | A1 * | 4/2004 | Liu | ........................ | G01R 29/26 324/750.3 |
| 2005/0261880 | A1 * | 11/2005 | Gorin | ..................... | G01R 23/16 702/191 |

* cited by examiner

*Primary Examiner* — Jeff Natalini
(74) *Attorney, Agent, or Firm* — Dinsmore & Shohl LLP

(57) ABSTRACT

A system and method for identifying an electrical noise propagation path through an object, such as an automotive vehicle, from a source of periodic electrical noise. An electrical noise sensor is positioned at a selected area on the object which generates an output signal representative of the magnitude of the electrical noise. A trigger generator generates a trigger signal in synchronism with a source of periodic electrical noise and that trigger signal is connected as an input signal to measurement equipment connected to the sensor to initiate electrical noise reading by the sensor. A recorder then records the output from the sensor. The electrical noise sensor is moved to different areas on the object to determine the electrical noise propagation path.

14 Claims, 4 Drawing Sheets

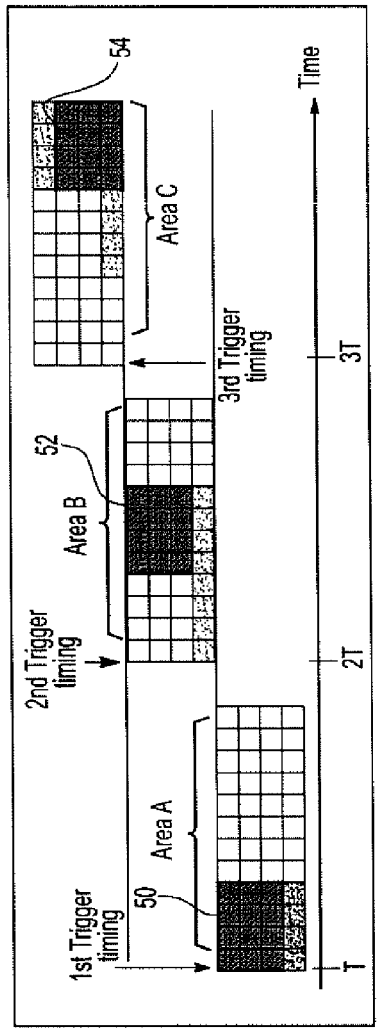
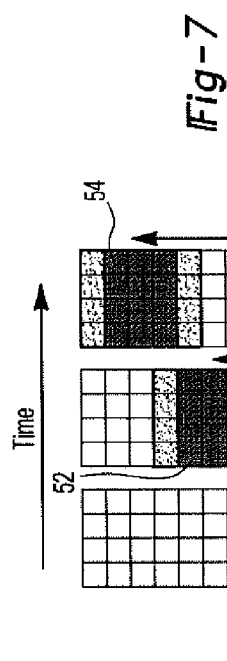
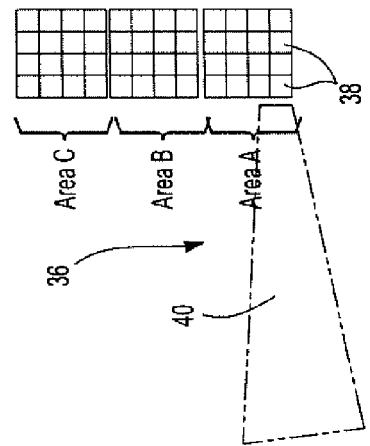
Fig-6
Fig-7

METHOD AND SYSTEM FOR IDENTIFYING AN ELECTRICAL NOISE PROPAGATION PATH

BACKGROUND OF THE INVENTION

I. Field of the Invention

The present invention relates to a system and method for identifying an electrical noise propagation path through an object, such as an automotive vehicle.

II. Description of Related Art

Complicated electrical systems, such as hybrid electrical automotive vehicles, electric automotive vehicles and other electrical components, contain numerous sources of periodic electrical noise. For example, in an electric or hybrid automotive vehicle, the inverter which provides power to the vehicle generates electrical noise on a periodic basis. In a typical electrical component, the processors, the regulators, and the oscillators have their own frequencies and cause the electrical noises in synchronism with the clocks. The generation of electrical noise is due primarily to the high frequency and speed switching devices.

The periodic generation of noise in such electrical systems can cause malfunctions or otherwise interfere with the other components of the electrical system. For example, in an automotive vehicle the electrical noise generated by the inverter can interfere with the infotainment system as well as the navigation system for the automotive vehicles.

In order to prevent interference by electrical noise with the vehicle systems, it has been the previous practice to identify the propagation path for the electrical noise through the vehicle. Once the propagation path for the electrical noise through the vehicle has been identified, steps may be taken to address and reduce the magnitude of the electrical noise thus protecting the other electrical systems in the vehicle from interference by the electrical noise.

In the past, it has been the practice to place a number of different electrical noise sensors throughout the vehicle and then empirically determine the amount of electrical noise detected by each sensor. Once the magnitude of the electrical noise from each sensor is identified, technicians would then estimate the propagation path for the electrical noise. Oftentimes, additional readings for the electrical noise were necessary to confirm the actual propagation path for the electrical noise.

These previously known procedures for determining the propagation path through the automotive vehicle for electrical noise, however, suffered several disadvantages. One disadvantage is that the cost for each electrical noise sensor is relatively high thus increasing the overall cost for testing the vehicle for electrical noise due to the multiple sensors necessary to cover every area suspected of lying in the propagation path for the electrical noise. A still further disadvantage of this previously known method and system for determining the propagation path for the electrical noise through the vehicle is that the overall testing and identification of the noise propagation path was prolonged and therefore expensive in labor cost. Furthermore, the overall conclusions reached by the technicians for the propagation path of the electrical noise were sometimes inaccurate.

SUMMARY OF THE PRESENT INVENTION

The present invention provides both a system and method for identifying an electrical noise propagation path through an object, such as an automotive vehicle or electrical components.

In brief, an electrical noise sensor is positioned at a selected area in the system. This electrical noise sensor generates an output signal representative of the magnitude of electrical noise detected at that selected area. Preferably, the electrical sensor comprises an array of sensors in which each sensor generates its own independent output signal.

After the source of electrical noise, such as the inverter in a hybrid or electrical vehicle or a processor of electrical component, is identified, a trigger generator generates a trigger signal in synchronism with that source of periodic electrical noise. For example, in the inverter for an electrical or hybrid automotive vehicle, the switching transistors for the inverter constitute a known source of noise and cause a noise in synchronism with the switching. Consequently, by monitoring the switching based on the voltage and/or current for the switching transistor such as a gate signal, output voltage/current of the switching transistor, and output voltage/current of inverter, the trigger generator generates an output trigger signal in synchronism with the generation of the periodic noise from the inverter. In electrical component, switching of processer constitute a source of noise. Consequently, by monitoring the clock signal, the trigger generator generates an output trigger signal in synchronism with the clock.

The trigger signal from the trigger generator is then coupled as an input signal to noise measuring equipment connected to the sensor(s) to initiate the electrical noise reading by the sensor(s). Consequently, the actual reading of the noise from the sensor for a finite time, e.g. $\Delta t$, occurs in synchronism with the generation of the noise from the noise source or inverter. That output signal or signals from the sensor is then stored in an electronic recording device, such as a hard drive, memory stick, etc.

Thereafter, the sensor is moved to a new selected area of the system and the above process is iteratively repeated for a plurality of selected areas on the vehicle. A programmed processor then analyzes the stored data from the multiple selected areas on the vehicle and generates a map indicative of the electrical noise propagation path through the vehicle such as a time-change of the magnitude at each area or the vector to indicate the noise propagation.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which:

FIG. 6 is a graph illustrating the operation of the present invention through a plurality of different selected areas;

FIG. 7 is a graph illustrating a mapping of the propagation path of the electrical noise;

DETAILED DESCRIPTION OF A PREFERRED EMBODIMENT OF THE PRESENT INVENTION

Figure 1:
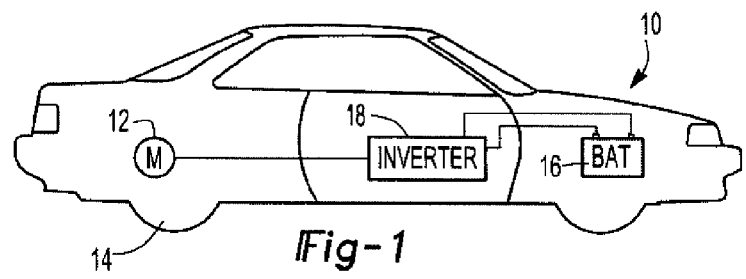
FIG. 1 is a diagrammatic view illustrating a hybrid or electric vehicle.

With reference first to FIG. 1, an electric or hybrid automotive vehicle 10 (hereinafter collectively referred to as an electric vehicle) is illustrated diagrammatically. In the conventional fashion, the electric vehicle 10 includes at least one alternating current electric motors 12 operatively connected to the drive wheels 14 of the vehicle 10. A DC storage battery 16 provides the electrical power to the motor 12.

Since the battery 16 provides DC power, an inverter 18 is electrically connected between the battery 16 and the motor 12 to convert the DC electrical power from the battery 16 to AC power for the motor 12.

Figure 2:
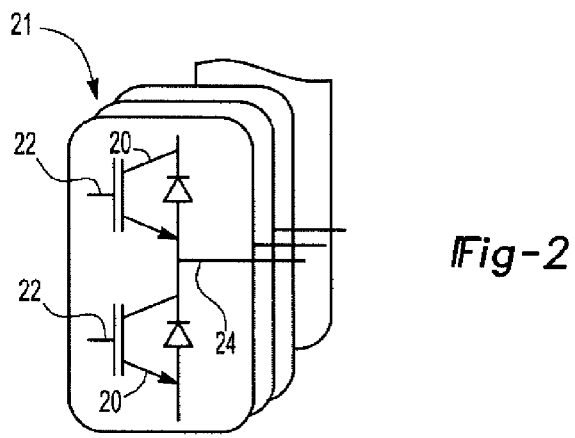
FIG. 2 is a diagrammatic view illustrating a bank of inverter switching transistors.

With reference now to FIG. 2, an exemplary bank 21 of switching transistors 20 of the type used by the inverter 18 is illustrated. The transistors 20 illustrated in FIG. 2 are two FET transistors having their drains and sources connected in series with each other and each transistor 20 has a gate 22 although other types of switching devices may be used. When a signal is provided to the gates 22, the transistors 20 conduct and generate an output signal at their output 24.

Figure 3:
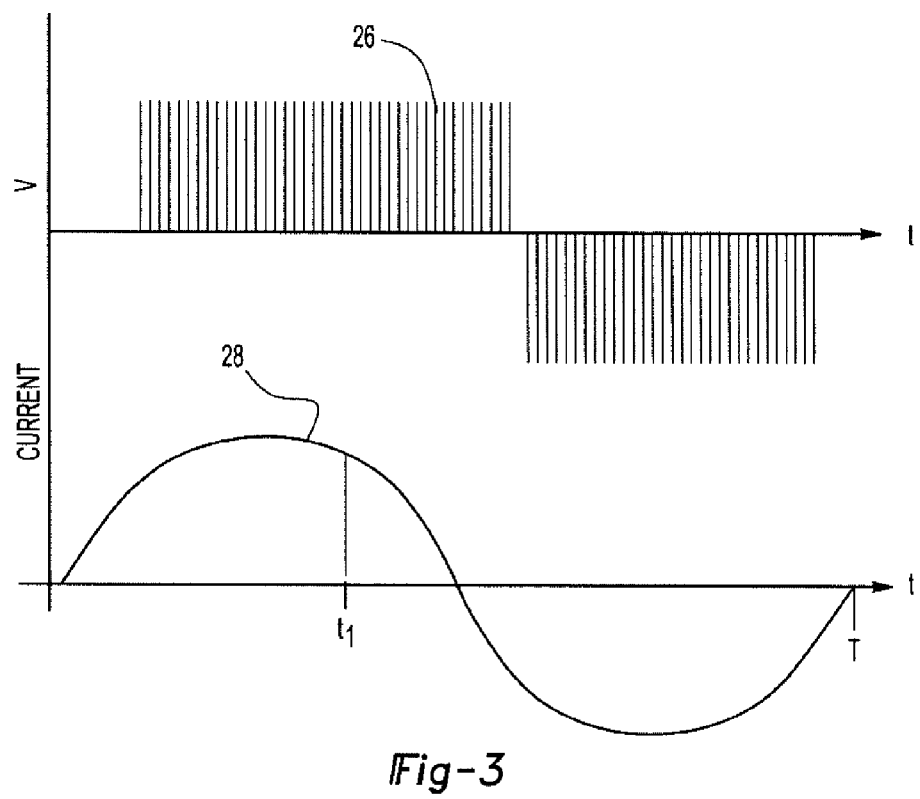
FIG. 3 is graphs illustrating the voltage and current output from the inverter.

With reference to FIGS. 2 and 3, the bank 21 includes multiple transistor pairs. A voltage signal, illustrated by graph 26 in FIG. 3, is applied sequentially to the gates 22 of the sequential transistor pairs 20 in the bank 21 to generate the AC current output signal 28. This AC output current signal 28 then powers the electrical motor 12 (FIG. 1) for the vehicle 10.

The high currents required to power the electrical motor 12 for the vehicle 10 require the switching of high currents by the inverter 18 and are of a known source of electrical noise in the vehicle 10. Furthermore, the noise generated by the inverter is periodic.

Figure 4:
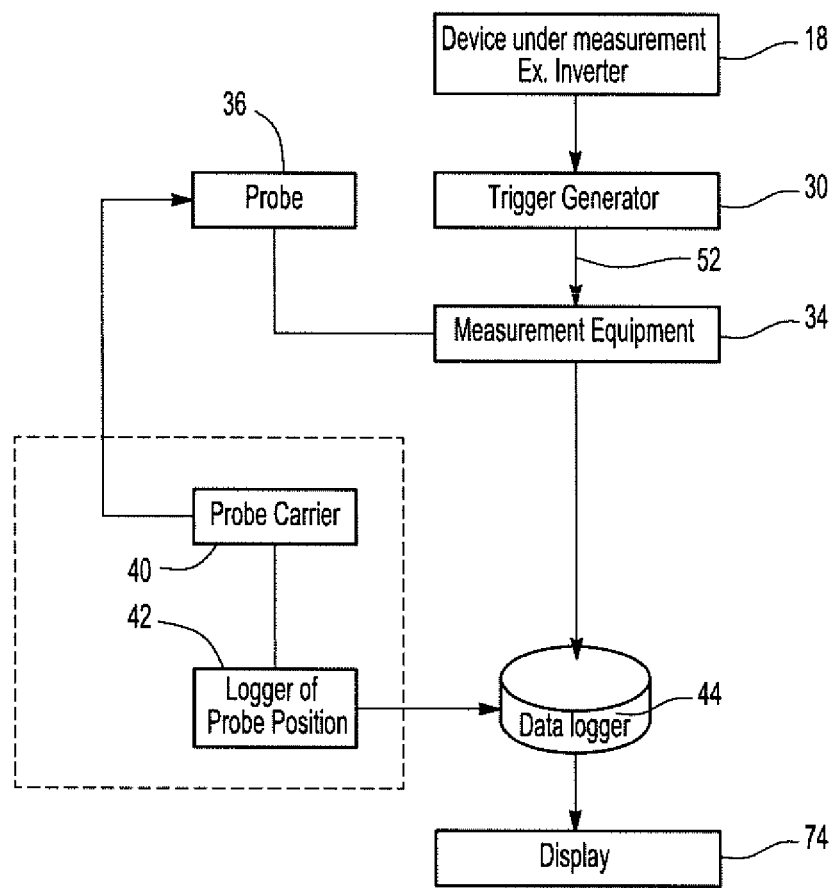
FIG. 4 is a block diagrammatic view illustrating a preferred embodiment of the present invention.
Figure 5:
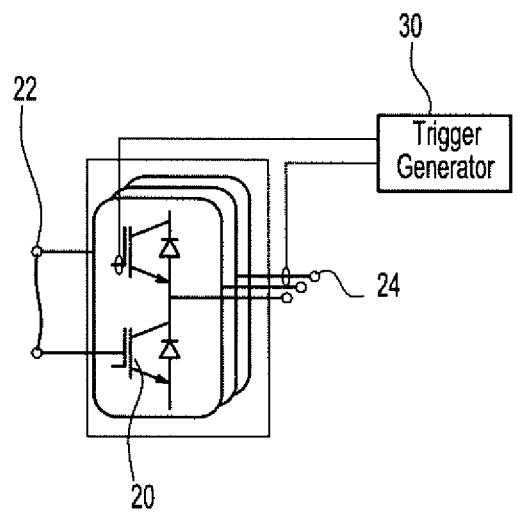
FIG. 5 is a diagrammatic view illustrating a trigger generator and a device under testing.

With reference now to FIGS. 3-5, a block diagrammatic view illustrating the system of the present invention is shown. A trigger generator 30 is coupled to the device, e.g. the inverter 18, which is the noise source. In order to precisely synchronize the trigger generator 30 to the inverter 18, the input to the trigger generator is connected to a selected transistor pair, e.g. the transistor pair which generates the output AC signal 28 at time $t_1$. Consequently, the trigger generator 30 generates a signal on its output 32 in synchronism with the operation of the inverter.

Referring to FIG. 4, the output signal 52 from the trigger generator 30 is coupled as an input signal to the electrical noise measurement equipment 34 which initiates a reading of the electrical noise from an electrical noise probe 36. The actual duration of the measurement of the noise by the measurement equipment 34 from the probe 36 is preset, either by the duration of the trigger signal from the trigger generator 30, or by the measurement equipment 34.

With reference now to FIGS. 4 and 6, the probe 36 preferably comprises an array of sensors 38. For example, as shown in FIG. 6, the array of sensors 38 for the probe 36 is illustrated as a 4×4 array of sensors 38. However, this is by way of example only, and the array can contain fewer or more sensors 38 without deviation from the spirit or scope of the invention.

The probe 36 is mounted to a probe carrier 40 which is positioned by the technician at a first selected area on the vehicle 10. In practice, the technician selects an area on the vehicle suspected of lying in the propagation path for the electrical noise from the inverter. The technician or system then inputs the position of the probe in the propagation path by input devices, such as a keyboard, a mouse, etc. That position information is then stored in a data logger 44, such as a hard drive, memory stick, and/or the like.

In operation, with the probe 36 positioned at a first selected area by the probe carrier 40, the measurement equipment 34 measures the electrical noise at the first selected area for a preset time interval in synchronism with the inverter due to the trigger generator 30. The measured electrical noise from the probe 36 is then provided as an output signal from the measurement equipment 34 to the data logger 44.

An exemplary output signal from the measurement equipment 34 is shown in FIG. 6 for the first selected area or area A. As shown at area A, high electrical noise is detected as shown at 50 during the time period beginning at time T. This noise data is then recorded with the time measured time information elapsed from the trigger timing by the data logger 44 associated with the probe position information (or position/location information of the selected area A).

Thereafter, the probe 36 is moved by the probe carrier 40 to a second selected area or area B as shown in FIG. 6. The second selected area or area B is selected by the technician or the system as being in the propagation path for the electrical noise. In this example, the second selected area or area B is further spaced from the inverter 18 than the first selected area or area A. The distance of the moving the selected area is the same as the area of measurement so that the noise propagation map can be generated based on the outcome of the measured noise and the position information of the measured area. As such, the detected electrical noise 52 is slightly time delayed from the periodic initiation of the trigger signal at time 2T where T equals one complete cycle of the AC waveform 28 (FIG. 3) if the inverter is the noise source and it has a constant cycle. If the inverter has not a constant cycle, the time difference between each trigger is not constant. It is also possible that trigger generator does not always output a periodical trigger. The trigger generator may output a signal every time a preset condition of the device. It is also possible that trigger generator does not always output a periodical trigger. The trigger generator may output a signal every time a preset condition of the device. The noise data is measured and recorded with the time information elapsed from the second trigger timing 2T in the data logger 44 associated with the probe position information (or position information of the selected area B).

The probe 36 is then moved by the probe carrier 40 to a selected area on the vehicle suspected of being in the propagation path for the electrical noise but further away from the inverter than the second selected area or area B. As shown in FIG. 6, the electrical noise signal is detected at 54, but time delayed from the noise signal 52 detected at the second selected area or area B. This overall process is then repeated for as many selected areas, e.g. area C, as desired.

With reference now to FIG. 7, a processor is preferably programmed to generate a noise map based on the detected electrical noise 50, 52, and 54 for all of the selected areas with the position information of the measured areas. And the processor also programmed to generate a noise propagation movie by generating a plurality of noise maps based on the noise data, location information of the selected area and elapsed time from the trigger timing and displaying the plurality of noise maps as the movie in order of the elapsed time from the trigger timing. The plurality of the noise maps can be displayed in the same time like FIG. 7 depicting based on the elapsed time from the each trigger timing. This noise propagation map or movie thus illustrates the propagation of the electrical noise through the vehicle.

In some situations, there may be extraneous electrical noise present during the trigger signal from the trigger generator 30 from a source other than the inverter. In order to isolate the electrical noise signal from the inverter, multiple measurements may be taken at each selected area and then averaged to isolate the inverter noise from other noise sources. Preferably, a processor is programmed to perform this average calculation.

Figure 8:
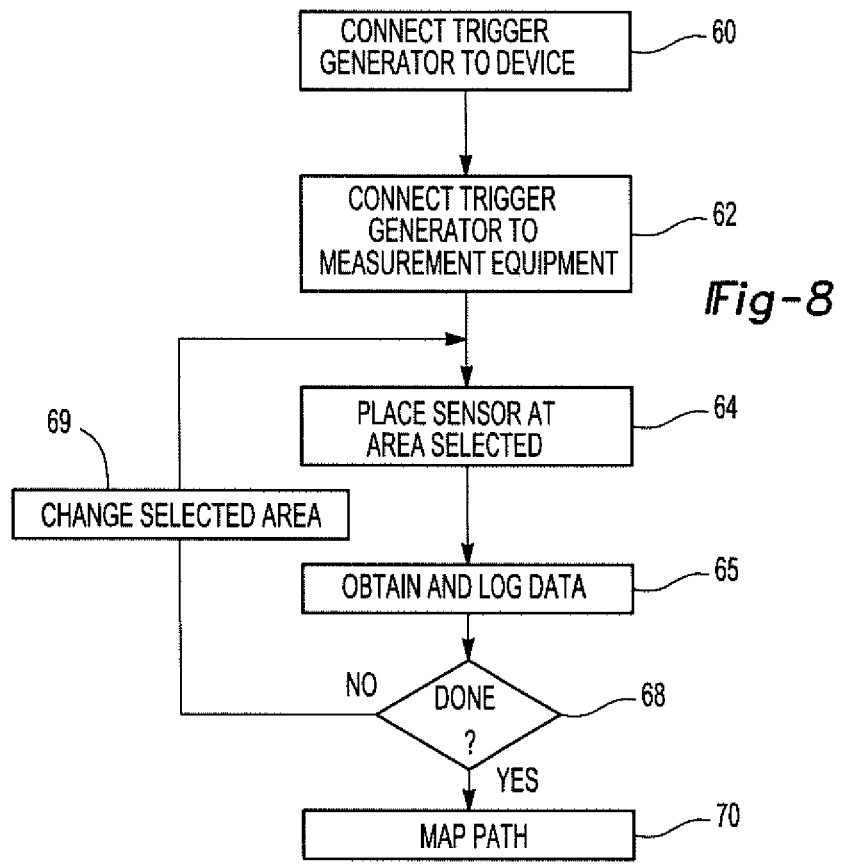
FIG. 8 is a flowchart illustrating the operation of the present invention.

With reference now to FIG. 8, a flowchart illustrating the method of the present invention is shown. At step 60, the trigger generator is connected to the device under measurement. Step 60 then proceeds to step 62. At step 62, the trigger generator is connected to the measurement equipment. Step 62 then proceeds to step 64.

At step 64, the sensor is placed at a selected area on the vehicle. This area is selected as suspected of being in the propagation path for the electrical noise. Step 64 then proceeds to step 65.

At step 65, the measurement equipment obtains and logs the data. Preferably, a plurality of data are obtained for the sensor output on the selected area every trigger timing and then averaged to eliminate extraneous transient noise from other sources. Step 65 then proceeds to step 68.

At step 68 it is determined if a sufficient number of selected areas have been measured by the sensor. If not, step 68 branches to step 69 in which a different area is selected. Step 69 then proceeds back to step 64 and continues to iterate for different selected areas until the data for a sufficient number of selected areas have been attained. When this occurs, step 68 proceeds to step 70 where the data is mapped, preferably by a programmed processor, and displayed to the technician. Any form of a display 74 (FIG. 4) may be obtained, such as a video screen, printer, and the like.

Figure 9:
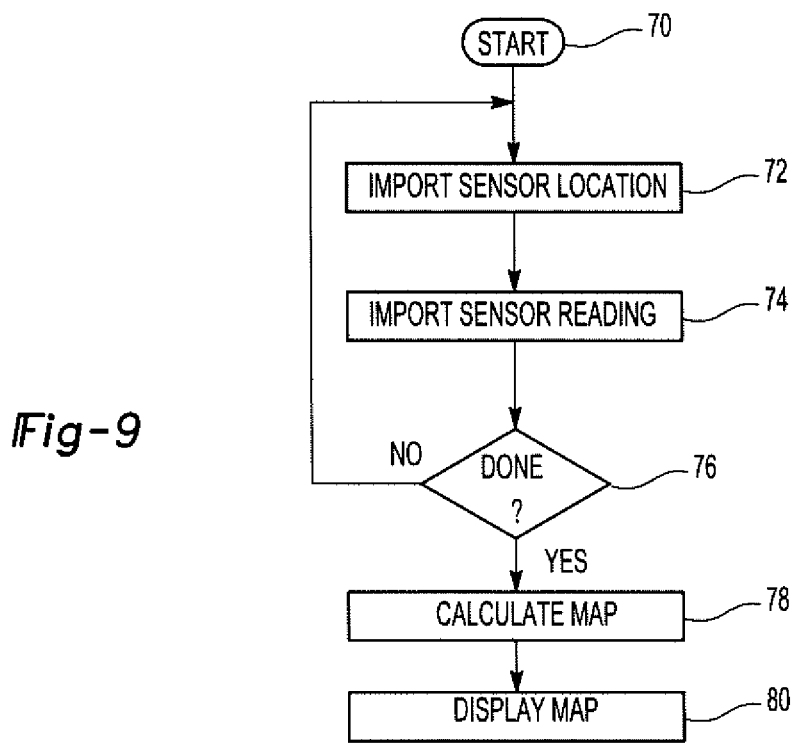
FIG. 9 is a flowchart.

With reference to FIG. 9, a flowchart is shown to analyze and display the data. At step 70 the program is initiated and step 70 proceeds to step 72 where the first sensor location is read from the data logger 44. Step 72 then proceeds to step 74 where the sensor output is similarly read from the data logger for the first sensor location. Step 74 then proceeds to step 76.

At step 76 the program determines if all of the measured areas have been read from the data logger. If not, step 76 branches back to step 72 and reiterates the above steps for the next sensor location. If all of the sensor locations and readings have been retrieved from the data logger 44, step 76 proceeds to step 78.

At step 78 a map or graph is calculated showing all of the sensor locations and sensor measurements for the vehicle. Step 80 then displays the noise map or the plurality of noise maps as noise propagation path information on the display or output device. The system can display the plurality of the noise map according to the elapsed time from the trigger as shown in FIG. 7 and this noise propagation map can show a time-change of magnitude of the electrical noise and/or vector of direction of the noise propagation path.

From the foregoing, it can be seen that the present invention provides an improved method and system for identifying the propagation path for electrical noise in electrical vehicles. A primary advantage of the present invention is that a single probe 36 may be utilized to detect the electrical noise in a plurality of different locations within the vehicle since the detection of electrical noise by the probe is synchronized with the inverter by the trigger generator 30.

Having described our invention, many modifications thereto will become apparent to those skilled in the art to which it pertains without deviation from the spirit of the invention as defined by the scope of the appended claims.

We claim:

1. A method for identifying an electrical noise propagation path through an object from a source of periodic electrical noise comprising the steps of:
    a) positioning an electric noise sensor of a noise measurement device at a selected area on the object, the noise sensor generating an output signal to the noise measurement device representative of the magnitude of electrical noise,
    b) generating a trigger signal in synchronism with the source of periodic electrical noise,
    c) connecting the trigger signal to the noise measurement device to initiate an electrical noise reading from the sensor by the noise measurement device, the noise measurement device generating an output signal as noise data,
    d) recording the noise data output from the measurement device associated with the location information of the selected area,
    e) moving the sensor to a different selected area, and
    f) reiterating steps a)-e), and
    g) identifying the noise propagation path based on the noise data output from the multiple selected areas of the object.

2. The method as defined in claim 1 wherein the sensor comprises an array of sensors.

3. The method as defined in claim 1 wherein the object is an automotive vehicle.

4. The method as defined in claim 1 wherein the recording step comprises the step of recording the magnitude of the sensor output signal to a computer database.

5. The method as defined in claim 1 comprising the steps of:
    inputting a plurality of output signals from the sensor for each selected area,
    computing an average sensor output signal for each selected area, and
    thereafter recording the average sensor output signal.

6. The method as defined in claim 1 further comprising the step of generating a noise map based on the location information of the selected area and the noise data.

7. The method as defined in claim 1 further comprising the steps of:
    generating a plurality of noise maps based on the noise data, location information of the selected area and elapsed time from the trigger timing; and
    displaying the plurality of noise maps in order of the elapsed time from the trigger timing.

8. A system for identifying an electrical noise propagation path through an object from a source of periodic electrical noise comprising:
    a noise measurement device having an electric noise sensor positioned at a selected area on the object, the noise sensor generating an output signal representative of the magnitude of electrical noise,
    a trigger generator which generates a trigger signal in synchronism with the source of periodic electrical noise,
    the trigger signal from the trigger generator being connected as an input signal to the noise measurement device to initiate an electrical noise reading by the sensor, the noise measurement device generating an output signal as noise data,
    a recorder which records the noise data output from the measurement device associated with the location information of the selected area, wherein the sensor is moved to different selected areas on the object collecting electrical noise readings for each selected area on the object, which are recorded by the recorder, a processor which determines the electrical noise propagation path based on the noise data from the multiple selected areas of the object.

9. The system as defined in claim 8 wherein the sensor comprises an array of sensors.

10. The system as defined in claim 8 wherein the object is an automotive vehicle.

11. The system as defined in claim 8 wherein the recorder comprises a computer database.

12. The system as defined in claim 8 wherein:

a plurality of sensor output signals are inputted for each selected area, a processor configured to compute an average sensor output signal for each selected area, and thereafter the recorder recording the average sensor output signal.

13. The system as defined in claim 8 wherein the processor is configured to generate a noise map based on the location information of the selected area and the noise data.

14. The system as defined in claim 8 wherein the processor is configured to:

generate a plurality of noise maps based on the noise data, location information of the selected area and elapsed time from the trigger timing; and output the plurality of noise maps in order of the elapsed time from the trigger timing.

\* \* \* \* \*